(12) United States Patent
Thibeault

(10) Patent No.: US 6,686,756 B2
(45) Date of Patent: Feb. 3, 2004

(54) VDDQ INTEGRATED CIRCUIT TESTING SYSTEM AND METHOD

(75) Inventor: Claude Thibeault, Brossard (CA)

(73) Assignee: Ecole de Technologies Superieure, Montreal (CA)

(*) Notice: Subject to any disclaimer, the term of this patent is extended or adjusted under 35 U.S.C. 154(b) by 0 days.

(21) Appl. No.: 10/163,919

(22) Filed: Jun. 5, 2002

(65) Prior Publication Data
US 2003/0001608 A1 Jan. 2, 2003

Related U.S. Application Data (63) Continuation-in-part of application No. 09/718,637, filed on Nov. 22, 2000.

(51) Int. Cl.[7] .............................................. G01R 31/02
(52) U.S. Cl. ...................................... 324/763; 324/765
(58) Field of Search ................................. 324/763–769, 324/73.1, 158.1; 327/387, 401–404; 714/25

(56) References Cited

U.S. PATENT DOCUMENTS 6,005,433 A * 12/1999 Hale ........................... 327/379
6,593,765 B1 * 7/2003 Ishida et al. ................. 324/765

OTHER PUBLICATIONS

C. Thibeault; "An Histogram Based Procedure for Current Testing of Active Defects"; 1999 IEEE International Test Conference, Sep. 1999; pp. 714–723.

Isawa et al.; "High–Speed $I_{DDQ}$ Measurement Circuit"; 1996 IEEE International Test Conference; pp. 112–117 (no month).

Rochit Rajsuman; "Iddq Testing for CMOS VLSI"; Proceedings of the IEEE; vol. 88, No. 4; Apr. 2000, pp. 544–566.

* cited by examiner

Primary Examiner—Evan Pert
Assistant Examiner—Minh N. Tang
(74) Attorney, Agent, or Firm—Merchant & Gould P.C.

(57) ABSTRACT

A system for Vddq integrated circuit (IC) testing is described herein. The systems teaches the positioning of a resistive element between a voltage source and the power supply terminal of the IC under test and the approximation of the voltage value at the power supply terminal when the IC is generally in a steady state. Depending on the approximated voltage value, the IC under test may be determined faulty or not.

8 Claims, 6 Drawing Sheets

VDDQ INTEGRATED CIRCUIT TESTING SYSTEM AND METHOD

This application is a Continuation-In-Part of U.S. application Ser. No. 09/718,637, filed Nov. 22, 2000.

FIELD OF THE INVENTION

The present invention relates to Integrated Circuit (IC) testing. More specifically, the present invention is concerned with a Vddq IC testing system.

BACKGROUND OF THE INVENTION

Various test strategies and systems have been designed to efficiently test electronic integrated circuits to detect manufacturing defects. One of the test method that is widely used is the so called "Iddq" testing method that is based on the measure of the quiescent power supply current, hence the terminology Iddq, of a CMOS IC. To determine whether the IC passes or fails the test, a measured current value is usually compared to a threshold value.

Generally, a main drawback of Iddq testing is its relatively low frequency of operation, yielding a relatively slow testing procedure.

Furthermore, with emerging submicron technologies and their increased leakage current levels, determining the threshold that separates faulty ICs from good ICs becomes increasingly difficult, which is another major drawback of the conventional Iddq testing method.

From the foregoing, it is therefore apparent that there is still room in the art for improvements in IC testing systems.

OBJECTS OF THE INVENTION

An object of the present invention is therefore to provide an improved IC testing system.

SUMMARY OF THE INVENTION

More specifically, in accordance with an aspect of the present invention, there is provided a system for testing an integrated circuit (IC) having a power supply terminal VDD for defects, the system comprising:

a voltage source having a voltage source output terminal Vaa;
  a resistive element connected to the voltage source output terminal Vaa; the resistive element being connectable to the power supply terminal VDD of the IC;
  a controllable output voltage source having an output voltage terminal VVS;
  a switch element SWA so configured as to selectively connect the output voltage terminal VVS to the power supply terminal VDD;
  a differentiator connected to the power supply terminal VDD; the differentiator being so configured as to determine a direction of the voltage variation at the power supply terminal VDD; and
  a controller connected to the controllable output voltage source, to the switch element SWA, to the differentiator and to the IC to thereby supply at least one test vector thereto; the controller being so configured as to approximate a voltage value of the power supply terminal VDD and to determine, via the approximated voltage value, if the IC is faulty.

According to another aspect of the present invention, there is provided a system for testing an integrated circuit (IC) having a power supply terminal VDD for defects, the system comprising:

a voltage source having a voltage source output terminal Vaa;
  a resistive element connected to the voltage source output terminal Vaa; the resistive element being connectable to the power supply terminal VDD of the IC;
  first, second and third controllable output voltage sources having respective output voltage terminals;
  first, second and third switch elements so configured as to selectively connect the output voltage terminal of a corresponding controllable output voltage source to the power supply terminal VDD;
  a differentiator connected to the power supply terminal VDD; the differentiator being so configured as to determine a direction of a voltage variation at the power supply terminal VDD; and
  a controller connected to the controllable output voltage sources, to the switch elements, to the differentiator and to the IC to thereby supply at least one test vector thereto; the controller being so configured as to connect the output voltage terminal of one of the first second and third controllable output voltage sources according to data supplied thereto by the differentiator; the controller being so configured as to approximate a voltage value of the power supply terminal VDD and to determine, via the approximated voltage value, if the IC is faulty.

As will easily be understood by one skilled in the art, the expression "Vddq testing" is to be construed as a test that is based on a quiescent power supply voltage in contrast with "Iddq testing", which is a test that is based on a quiescent power supply current.

Other objects, advantages and features of the present invention will become more apparent upon reading of the following nonrestrictive description of preferred embodiments thereof, given by way of example only with reference to the accompanying drawings.

DESCRIPTION OF THE PREFERRED EMBODIMENT

A Vddq integrated testing method relying on a system according to an embodiment of the present invention will now be described with references to FIGS. 1 and 2.

In a nutshell, a general concept of the present invention is to place a resistive element (P-FET1) between a voltage output terminal (Vaa) of a voltage supply source and a power supply terminal (VDD) of an IC under test.

Since the current drain of the IC under test is expected to be very small when the IC is in a steady state, the voltage at the power supply terminal VDD is expected to be close to Vaa because only a small voltage drop in the resistive element P-FET1 is expected. As it is the case in Iddq testing, it is possible to determine if the IC under test is faulty, i.e. if it contains manufacturing defects, by comparing the resulting VDD value to a predetermined threshold or by other post-processing means.

Figure 1:
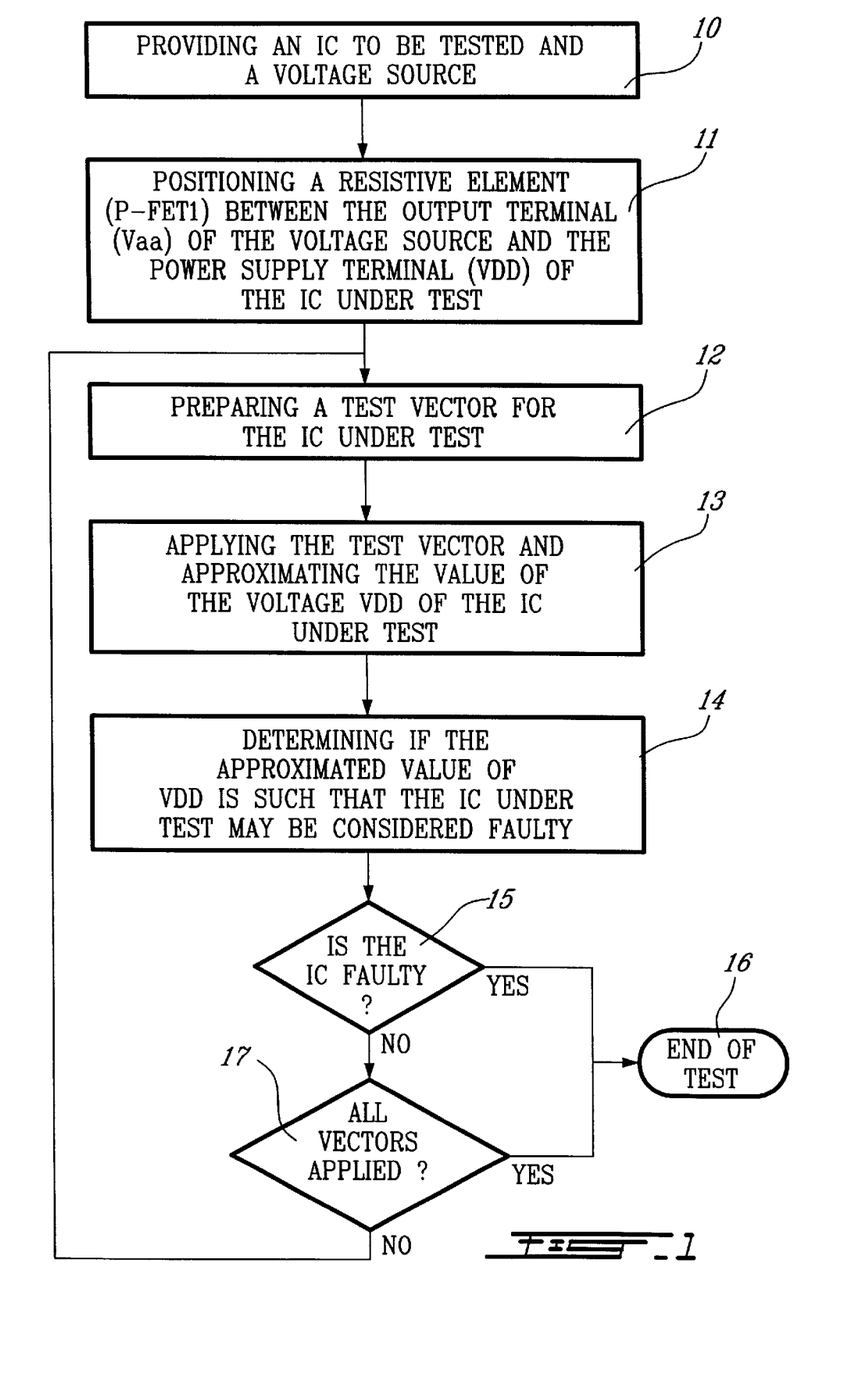
FIG. 1 is a general diagram of a Vddq IC testing method according to the present invention.

FIG. 1 summarizes this general concept. In step 10, the IC under test and a voltage source are provided. Step 11 is the positioning of the resistive element P-FET1 between the output terminal Vaa of the voltage source and the power supply terminal VDD of the IC under test. A test vector is then prepared for the IC under test (step 12). The test vector is then applied and the voltage present at the terminal VDD is then approximated. The approximated value of the voltage present at the terminal VDD is compared with a previous known value of VDD or stored for further post-processing (step 13).

From the result of this comparison or post-processing, step 14 determines if the IC under test is to be considered faulty. In step 15, should the IC under test be considered faulty, the test ends (step 16). Otherwise, the system then verifies that all the required test vectors have been applied to the IC under test (step 17). If it is so, the test ends (step 16). If not, the system returns to step 12 and a further test vector is prepared and applied.

Of course, as will easily be understood by one skilled in the art, more than one test vector is usually used to determine whether the IC under test is faulty. Therefore, steps 12, 13 and 14 are repeated as many times as different test vectors are applied.

The system of the present invention may also include methods for increasing the speed of the test. Indeed, as will be more easily understood by one skilled in the art upon reading the following description in relation to FIG. 2 of the appended drawings, which is a possible implementation of the comparing step 13 of FIG. 1, two strategies are proposed to decrease the time required to perform the Vddq test.

Generally stated, a first strategy is to provide a controllable switch (P-FET2) between the terminal of the voltage output Vaa and the terminal of the IC under test VDD. This switch, when in a conductive state, allows more current to flow from the voltage source to the IC under test, thereby decreasing the delay for the IC under test to reach again its steady state when a new test vector is applied thereto.

A second strategy involves actively determining the value of the voltage at the power supply terminal VDD by successively comparing the value of this voltage to predetermined values.

Figure 2:
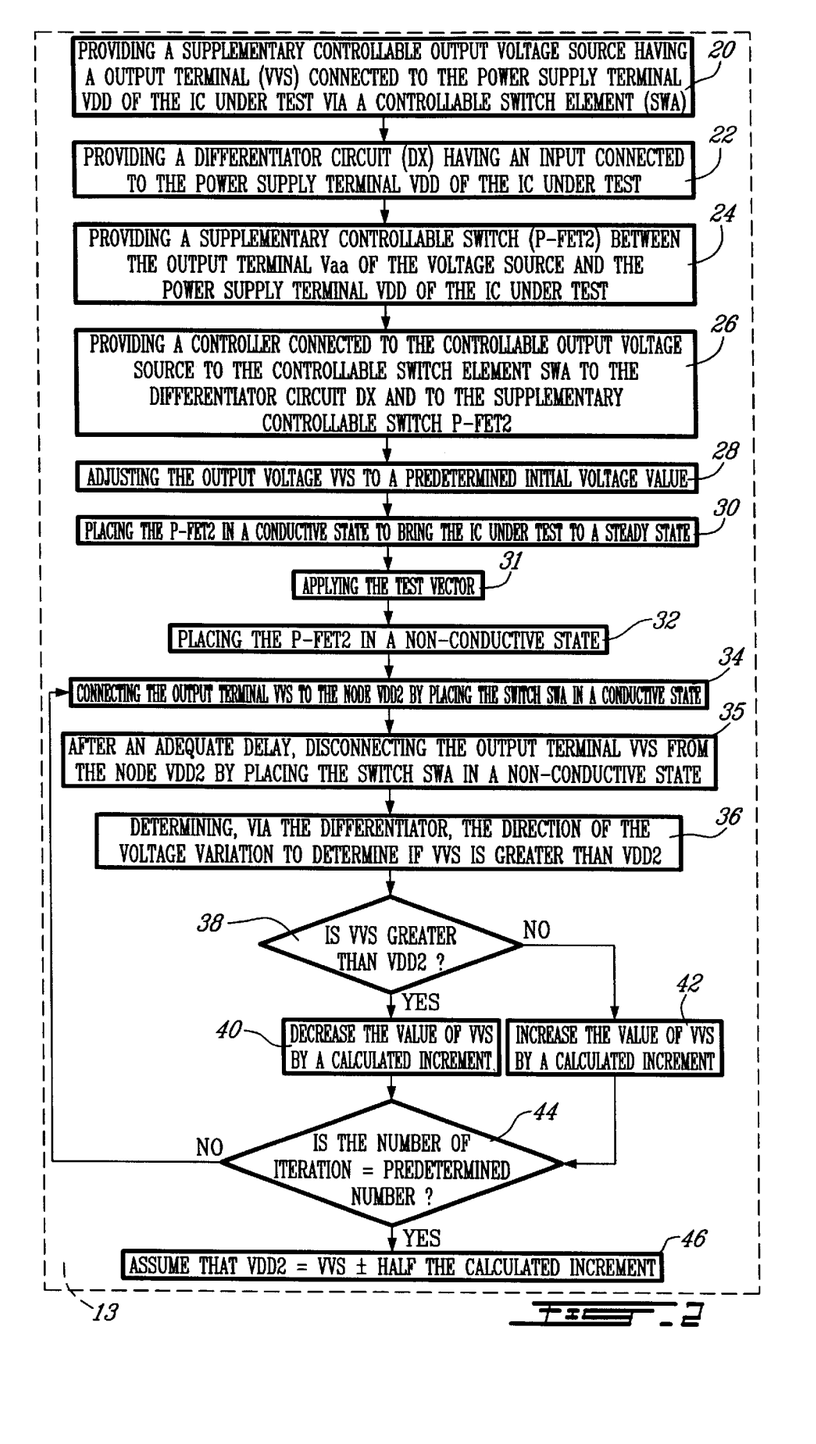
FIG. 2 is a more detailed diagram of the comparing step 13 of FIG. 1.

Turning now more specifically to FIG. 2 of the appended drawings, the implementation of these two strategies will be described.

Step 20 consists in providing a supplementary controllable output voltage source having a voltage output terminal (VVS) connected to the power supply terminal VDD of the IC under test. This can be advantageously achieved via a controllable switch element (SWA).

A differentiator circuit (DX) having an input connected to the power supply terminal VDD of the IC under test is also provided (step 22). The purpose of the differentiator circuit will be described hereinbelow.

Similarly, in step 24, a supplementary controllable switch (P-FET2) is provided between the output terminal Vaa of the voltage source and the power supply terminal VDD of the IC under test.

A controller is further provided (step 26) to control the controllable output voltage source VVS, the controllable switch element SWA, the differentiator circuit DX and the supplementary controllable switch P-FET2.

In step 28, the output voltage VVS is set to a predetermined initial value that is the central value of a predetermined voltage range that is advantageously large enough to contain foreseen possible values that the voltage at the terminal VDD may take. It is believed that one skilled in the art would have no problem in selecting the predetermined initial value for a specific IC to be tested.

In step, the switch P-FET2 is placed in a conductive state to allow the high switching currents to flow easily before a test vector is supplied thereto. Then the test vector is applied (step 31). Once all the switching is completed and all the logical values are stable, i.e. when the IC under test has reached a steady state under the test vector, the switch P-FET2 is returned to a non-conductive state (step 32). Steps 30 and 32 therefore embody the first above-noted strategy of decreasing the time required for the IC under test to reach its steady state. It is to be noted that the time required for the IC under test to reach a steady state is different from a type of IC to another. It is therefore believed within the skills of one versed in the art to determine the duration of the conduction period of the switch P-FET2, which is to correspond to the time required for the specific IC under test to reach a steady state after the test vector is applied.

The output terminal VVS is then connected to the power supply terminal VDD via the switch SWA (step 34). The node VDD2 is thereby brought to a voltage value dictated by the output terminal WS. After an adequate delay that ensures that the node VDD2 is indeed at the voltage value dictated by VVS, the switch SWA is placed back in a non-conductive state (step 35) to disconnect the node VDD2 from the output terminal VVS. Again, it is to be noted that the time required for the node VDD2 to reach the WS voltage is different from a type of IC to another. It is therefore believed within the skills of one versed in the art to determine the duration of the conduction period of the switch SWA, which essentially depends on the equivalent impedance as seen from the VVS.

Upon disconnection of the node VDD2 from the output terminal WS, the voltage of the node VDD2 tends to converge towards a final value, i.e., the value that is to be approximated. In step 36, the differentiator determines the direction of the voltage variation to determine whether VVS is greater than VDD2. In step 38, the actual comparison between the voltages present respectively at terminals WS and VDD2 takes place. If WS is greater than VDD2 (step 40), the value of VVS is decreased by a calculated increment. On the other hand, if VDD2 is greater than VVS (step 42), the value of WS is increased by a calculated increment.

The system then verifies whether the number of iteration is equal to a predetermined number of iteration (step 44), which is determined according to a desired precision of the final estimated value of the voltage present at terminal VDD.

If the predetermined number of iteration has been completed, the system assumes that the estimated voltage value of VDD equals VVS plus or minus half the calculated increment (step 46). If not, the system returns to step 34 to begin a new iteration with the adjusted value of VVS.

Examples of Determination of the Range of Voltage

There are several ways to determine a voltage range and the calculated increment, as will be described hereinbelow.

A first method consists in using a digital controllable voltage source that is controllable using 8 bits, i.e. 255 increments, and by setting the higher value, i.e. value 255, at the value of Vaa (for example, 3.3 volts). In this case, the initial voltage value would be value 128, i.e. the middle of the voltage range. After the first iteration, the value of VVS is adjusted to either 192 or 64 depending on the outcome of the comparison in step 38. Therefore, in a second iteration, the remaining range is further divided by two. As will easily be understood by one skilled in the art, after six iterations a precision of about 0.052 volts (4/255×3.3) is achieved for the value of VDD2. In other words, the value of VVS is adjusted midway between a current value of VVS and the corresponding end of the current voltage range.

A minor drawback of the above-mentioned method is that it considers that VDD2 may take any value between 0 and 3.3 volts.

A second method involves setting an initial threshold below which the IC under test is automatically considered faulty and starting the evaluation from this threshold. For example, if the IC under test has a nominal voltage of 3.3 volts, the initial threshold could be set to 2.0 volts. If the first iteration determines that VDD2 is below this value, the IC is automatically rejected as faulty. If VDD2 is above 2.0 volts, the voltage range is set between 2.0 volts (value 0) and 3.3 volts (value 255) and the test can continue as described hereinabove. As will be apparent to one skilled in the art, this second method has two advantages: it allows some faulty ICs to be rejected at the very beginning of the test through the use of a threshold and it needs less iterations to reach the same precision.

Figure 3:
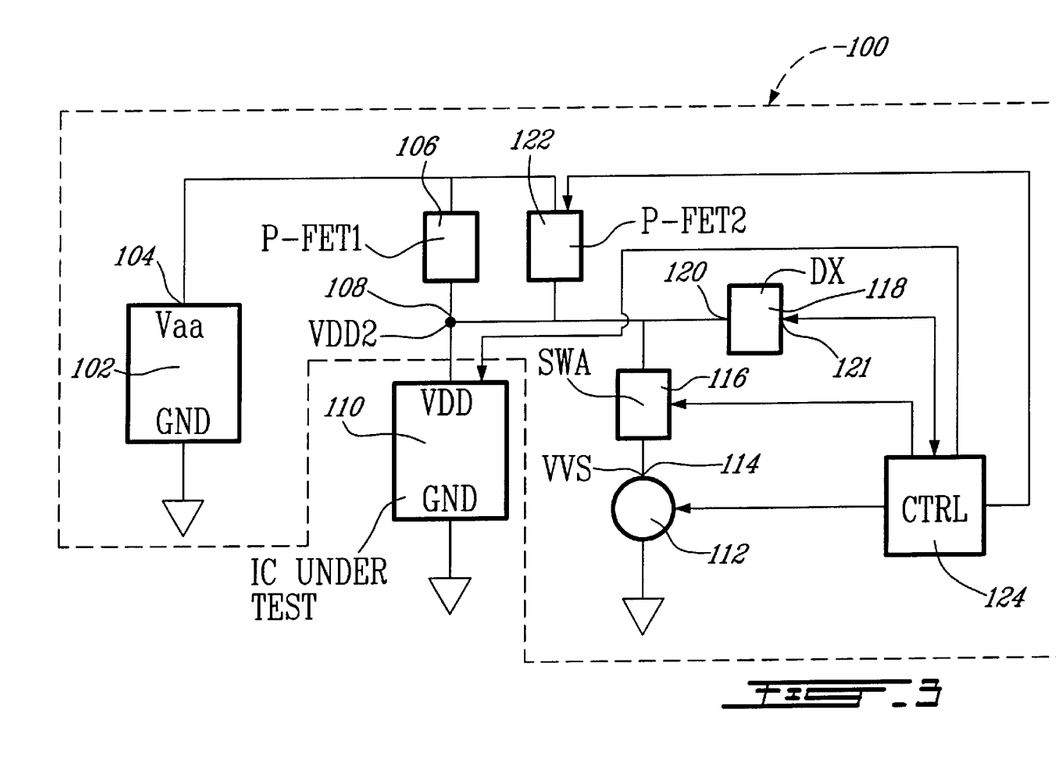
FIG. 3 is a block diagram of a Vddq IC testing system according to a first embodiment of the present invention.

Turning now to FIG. 3 of the appended drawings, a Vddq IC testing system 100 according to a first embodiment of the present invention will be described.

The testing system 100 includes a voltage source 102 having a known voltage output terminal Vaa 104 and a resistive element P-FET1 106 provided between the voltage output terminal Vaa 104 and a node VDD2 108 to which an IC under test 110 is to be connected.

The system 100 also includes a controllable output voltage source 112 having an output VVS 114 that may be connected to the node VDD2 108 via a controllable switch element SWA 116; a differentiator circuit 118 connected to the node VDD2 108 via an input 120, and a supplementary controllable switch P-FET2 122 connected between the output terminal Vaa 104 and the node VDD2 108.

Finally, the testing system 100 includes a controller 124 connected to the voltage source 112, to the switch 116 and to the switch 122 to enable an adequate operation of these elements. The controller 124 is also connected to the IC under test 110 to sequentially supply test vectors thereto. It is believed that one skilled in the art would be in a position to determine the number and nature of the test vectors to be applied before the testing of a particular IC is completed.

It is to be noted that should the resistive element P-FET1 106 take the form of a Field Effect Transistor, it could be controlled by the controller 124.

It is also to be noted that the differentiator 118 has an output 121 connected to the controller 124 to supply it with information about the direction of the voltage variation as discussed hereinabove, thereby allowing the controller 124 to determine if the value of the voltage of terminal VVS 114 is to be increased or decreased. For example, the differentiator 118 may supply two different signals to the controller 124, namely a first signal indicating that the voltage VVS 114 decreases and a second signal to indicate that the voltage VVS 114 increases.

The use of two different signals to indicate different directions of the voltage variation is advantageous for many reasons. First, it makes possible to select different thresholds for voltage increases and decreases. Second, it may accelerate the entire process in the close neighborhood of the final voltage since neither signal would then be emitted, thus enabling the controller to stop the process, which is not feasible when a single signal having two possible values is used. Third, it may be part of the effort to reduce the noise since the data is more precise than when a single signal is used.

Of course, the controller 124 can be programmable and is advantageously provided with instructions to monitor the system described hereinabove with respect to FIGS. 1 and 2. It is believed that one skilled in the art would have no problem selecting the controller and programming it accordingly.

The operation of the test system 100 is believed to be easily understandable by one skilled in the art having read the description of the method hereinabove.

The frequency of operation of the test system 100 is advantageous, for example when the system 100 implements strategies like the ones described hereinabove such as to increase the testing speed. Indeed, the switch P-FET2 122 is used to decrease the required time for the IC under test 110 to reach its steady state and the controllable voltage source 112 is used in the successive approximation of the value of the voltage present at the power supply terminal VDD by the increase or the decrease of the value of VVS.

Figure 4:
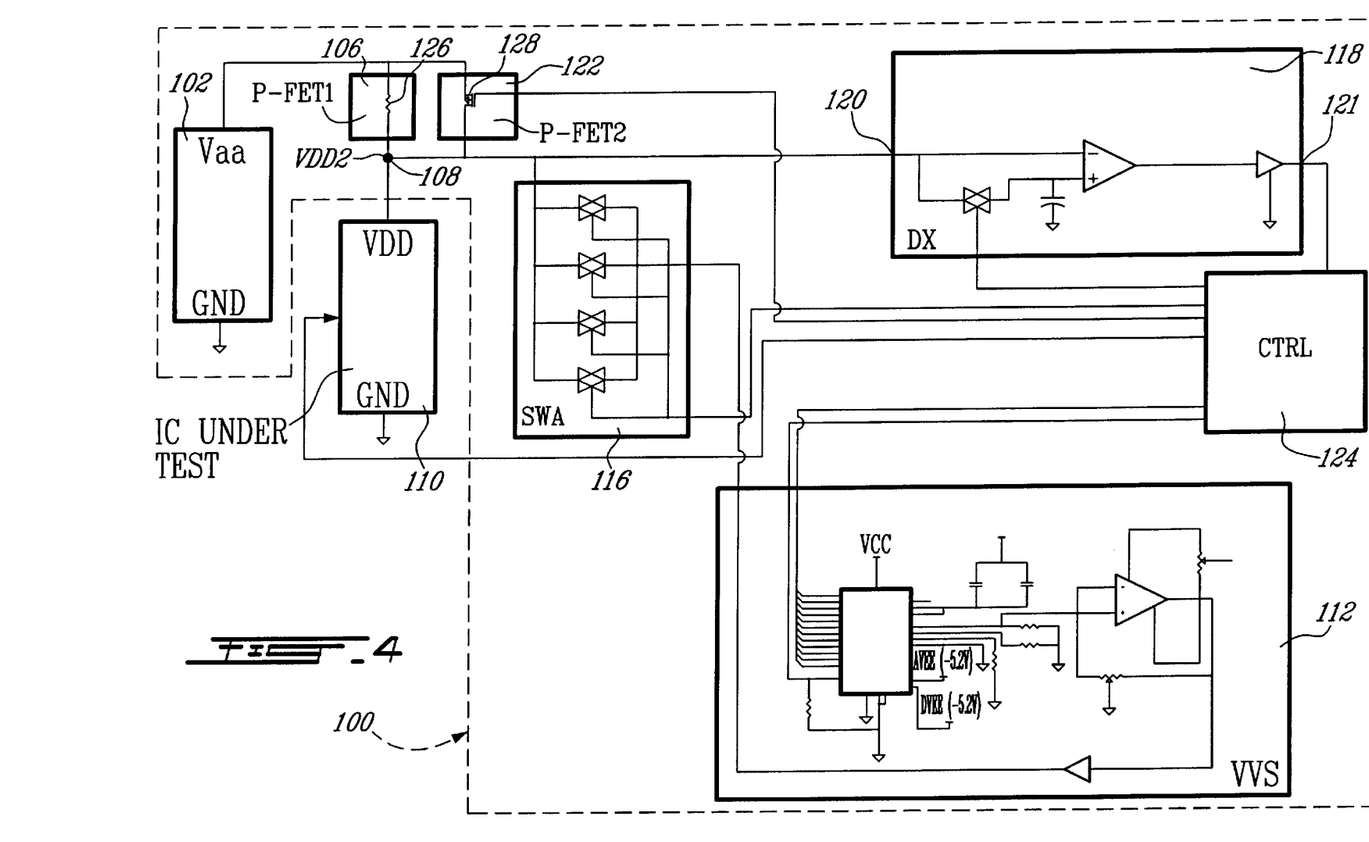
FIG. 4 is a more detailed circuit of the testing system of FIG. 3.

Turning now briefly to FIG. 4 of the appended drawings, a more comprehensive diagram of the system 100 is illustrated.

As can be seen from this figure, the resistive element P-FET1 106 is a resistor 126 and the supplementary controllable switch P-FET2 122 is a P-type field effect transistor (FET). The source 112 takes the form of a DAC having an output fed to an operational amplifier allowing the shaping of the signal and having an output supplied to a buffer. The controllable switch element SWA 116 takes the form of an analog switch and the differentiator circuit 118 includes a sample & hold circuit, a comparator and a buffer.

Figure 5:
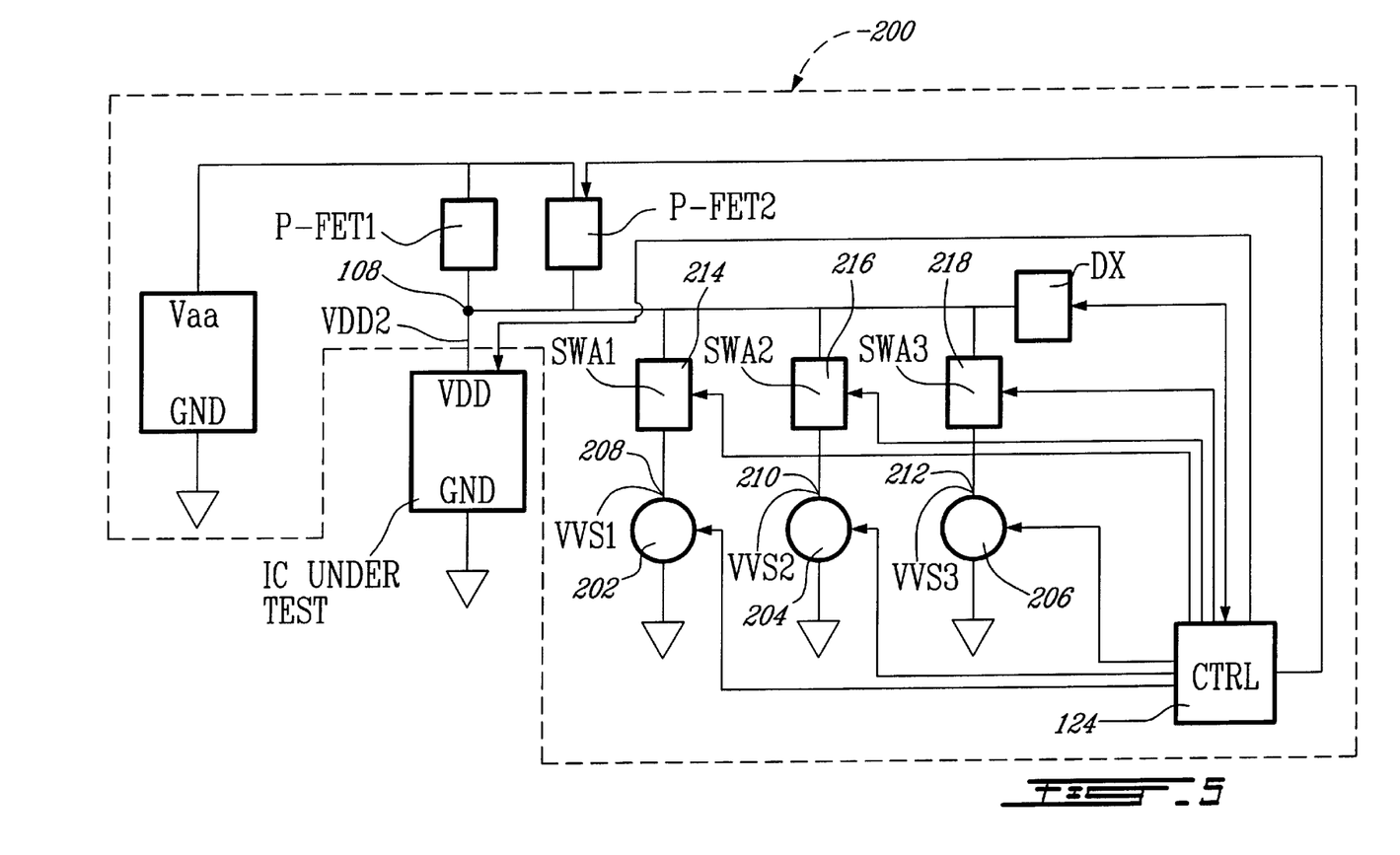
FIG. 5 is a block diagram of a Vddq IC testing system according to a second embodiment of the present invention.

FIG. 5 of the appended drawings illustrates a Vddq IC testing system 200 according to a second embodiment of the present invention. Since the testing system 200 is very similar to the testing system 100 of FIGS. 3 and 4, and for concision purposes, only the differences between these two systems will be described hereinbelow.

The main difference between the systems 100 and 200 is that the system 200 includes three (3) controllable output voltage sources 202, 204 and 206 having respective output terminals VVS1, VVS2 and VVS3 having reference numerals 208, 210 and 212 connected to the node VDD2 108 via respective controllable switching elements 214, 216 and 218.

Referring also to FIG. 2, this arrangement of three independently controlled output voltage source allows the controller 124, while one of the source 202, 204 or 204 is adjusted to the predetermined initial value (in step 28), to adjust the other two sources to the increased and decreased values of VVS (steps 42 and 40, respectively). The system 200 is thereby ready to connect the adequate voltage source to the node 108 in the next iteration of the process. As will easily be understood by one skilled in the art, this feature further decreases the testing time since it allows some of the steps described in relation to FIG. 2 to be done simultaneously.

Figure 6:
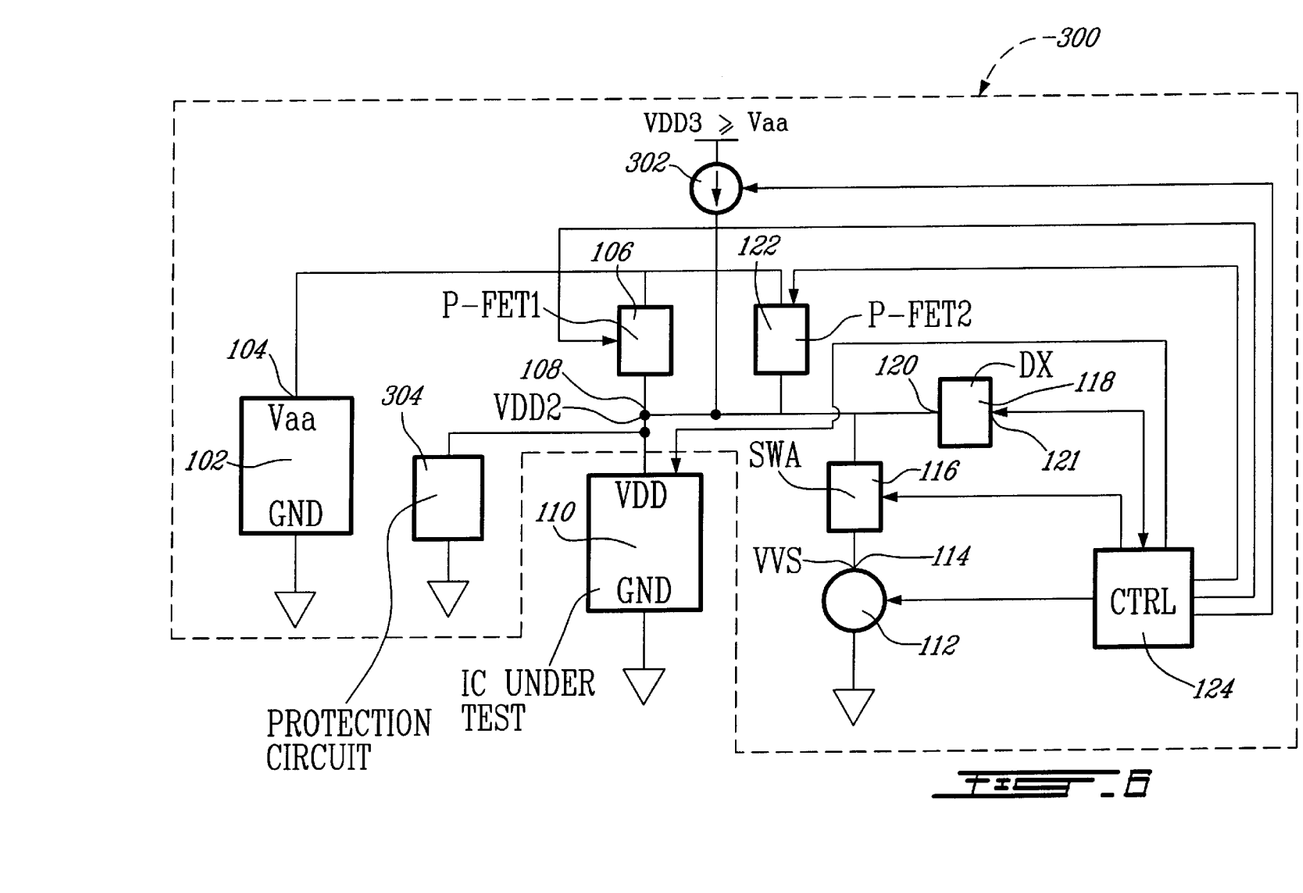
FIG. 6 is a block diagram similar to FIG. 3, illustrating a Vddq IC testing system according to a third embodiment of the present invention.

Turning now to FIG. 6 of the appended drawings, a Vddq IC testing system 300 according to a third embodiment of the present invention will be briefly described. Since the testing system 300 is very similar to the testing system 100 of FIGS. 3 and 4, and for concision purposes, only the differences between these two systems will be described hereinbelow.

The main difference between the systems 300 and the system 100 is that a current source 302 and a protection circuit 304 are added.

The main purpose of the current source 302 is to supply the main portion of the current required by the IC under test. Indeed, it has been found since the current required by CMOS circuits tend to increase as the size of the devices decreases, it may be interesting to provide a current source 302 that is initially set to supply the totality of the current required by the IC under test. If the IC under test is faulty, only the supplemental current required will be supplied by the source 102. This feature is also interesting since is allows the measure to be more precise since a larger value of the resistive element 106 may be used without accounting for a voltage drop caused by the normal stray current of the IC under test.

The introduction of the current source 302 in the system 300 makes it interesting to provide a protection circuit 304 since the initial current supplied by the current source 302 could be too high for subsequent test vectors. Should not protection circuit be used, this too high current could potentially damage the IC under test.

It is also to be note that in the system 300 the P-FET1 is controlled by the controller 124.

As will readily be understood by one skilled in the art, while the system described herein by way of different embodiments thereof measures the voltage at the power supply terminal of the IC under test, the system of the present invention can easily be modified to measure the voltage between the ground terminal of the IC under test and the electrical ground.

Although the present invention has been described hereinabove by way of preferred embodiments thereof, it can be modified, without departing from the spirit and nature of the subject invention as defined in the appended claims.

What is claimed is:

1. A system for testing an integrated circuit (IC) having a power supply terminal VDD for defects, said system comprising:

a voltage source having a voltage source output terminal Vaa;

a resistive element connected to said voltage source output terminal Vaa; said resistive element being connectable to the power supply terminal VDD of the IC;

at least one controllable output voltage source having an output voltage terminal VVS;

at least one switch element so configured as to selectively connect said output voltage terminal VVS to the power supply terminal VDD;

a differentiator connected to the power supply terminal VDD; said differentiator being so configured as to determine a direction of a voltage variation at the power supply terminal VDD; and a controller connected to said at least one controllable output voltage source, to said at least one switch element, to said differentiator and to the IC to thereby supply at least one test vector thereto; said controller being so configured as to approximate a voltage value of the power supply terminal VDD and to determine, via the approximated voltage value, if the IC under test is faulty.

2. The system for testing an integrated circuit as recited in claim 1, wherein said resistive element includes a field effect transistor (FET) controlled by said controller.

3. The system for testing an integrated circuit as recited in claim 1, further comprising a supplementary controllable switch connected to said voltage source output terminal Vaa and connectable to the power supply terminal VDD of the IC; said supplementary controllable switch being controlled by said controller.

4. The system for testing an integrated circuit as recited in claim 3, wherein said supplementary controllable switch includes a field effect transistor (FET).

5. The system for testing an integrated circuit as recited in claim 1, wherein said differentiator supplies said controller with; a first signal when a voltage at the power supply terminal VDD decreases and a second signal when the voltage at the power supply terminal VDD increases.

6. The system for testing an integrated circuit as recited in claim 1, further comprising a current source supplying at least a portion of the current required for the IC to operate.

7. The system for testing an integrated circuit as recited in claim 6, further comprising a protection circuit connected between the power supply terminal VDD and a ground.

8. A system for testing an integrated circuit (IC) according to claim 1, wherein said controller is further configured to connect the output voltage terminal of one of the at least one controllable output voltage sources according to data supplied thereto by said differentiator.

* * * * *